US012439669B2

(12) United States Patent
Nandi et al.

(10) Patent No.: US 12,439,669 B2
(45) Date of Patent: Oct. 7, 2025

(54) CO-DEPOSITION OF TITANIUM AND SILICON FOR IMPROVED SILICON GERMANIUM SOURCE AND DRAIN CONTACTS

(71) Applicant: Intel Corporation, Santa Clara, CA (US)

(72) Inventors: Debaleena Nandi, Hillsboro, OR (US); Chi-Hing Choi, Portland, OR (US); Gilbert Dewey, Beaverton, OR (US); Harold Kennel, Portland, OR (US); Omair Saadat, Portland, OR (US); Jitendra Kumar Jha, Hillsboro, OR (US); Adedapo Oni, North Plains, OR (US); Nazila Haratipour, Portland, OR (US); Anand Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 957 days.

(21) Appl. No.: 17/358,436

(22) Filed: Jun. 25, 2021

(65) Prior Publication Data
US 2022/0416032 A1 Dec. 29, 2022

(51) Int. Cl.
*H10D 64/23* (2025.01)
*H01L 21/28* (2006.01)
(Continued)

(52) U.S. Cl.
CPC ........... *H10D 64/251* (2025.01); *H01L 21/28* (2013.01); *H01L 21/76889* (2013.01);
(Continued)

(58) Field of Classification Search
None
See application file for complete search history.

(56) References Cited

U.S. PATENT DOCUMENTS 11,855,169 B2 * 12/2023 Tzeng ............... H01L 29/41791
2018/0076041 A1 * 3/2018 Bauer ............ H01L 21/823821
(Continued)

FOREIGN PATENT DOCUMENTS

CN 104377199 A * 2/2015 ....... H01L 21/02636
CN 104124171 B * 12/2017 ......... H01L 29/0642
(Continued)

OTHER PUBLICATIONS

Extended European Search Report from European Patent Application No. 22168998.7 notified Oct. 12, 2022, 12 pgs.
(Continued)

*Primary Examiner* — Michael Lebentritt
(74) *Attorney, Agent, or Firm* — Essential Patents Group, LLP

(57) ABSTRACT

Source and drain contacts that provide improved contact resistance and contact interface stability for transistors employing silicon and germanium source and drain materials, related transistor structures, integrated circuits, systems, and methods of fabrication are disclosed. Such source and drain contacts include a contact layer of co-deposited titanium and silicon on the silicon and germanium source and drain. The disclosed source and drain contacts improve transistor performance including switching speed and reliability.

20 Claims, 10 Drawing Sheets

(51) Int. Cl.
  *H01L 21/768*  (2006.01)
  *H10D 62/832*  (2025.01)
  *H10D 84/01*   (2025.01)
  *H10D 84/03*   (2025.01)
  *H10D 84/83*   (2025.01)

(52) U.S. Cl.
  CPC ......... H10D 62/832 (2025.01); H10D 84/013 (2025.01); H10D 84/038 (2025.01); H10D 84/83 (2025.01)

(56) References Cited

U.S. PATENT DOCUMENTS

| | | | |
|---|---|---|---|
| 2020/0098572 A1* | 3/2020 | Wang | H01L 21/02274 |
| 2020/0127091 A1* | 4/2020 | Glass | H10D 64/667 |
| 2021/0111246 A1 | 4/2021 | Lie et al. | |

FOREIGN PATENT DOCUMENTS

| | | | | |
|---|---|---|---|---|
| CN | 109427590 A | * | 3/2019 | ....... H01L 21/28088 |
| CN | 110223954 A | * | 9/2019 | ....... H01L 21/28518 |
| EP | 0551117 A2 | * | 7/1993 | ........... C23C 14/221 |
| EP | 4109553 A1 | * | 12/2022 | ......... H01L 29/0665 |

OTHER PUBLICATIONS

Mao, Shujuan, et al., "Improved Ti germanosilicidation by Ge pro-amorphization implantation (PAI) for advanced contact technologies", Microelectronic Engineering, vol. 201, Dec. 5, 2018, 10 pgs.

Yu, Hao, et al., "TiSi(Ge) Contacts Formed at Low Temperature Achieving Around $2\times10^{-9}$ Ohmcm2 Contact Resistivities to p-SiGe", IEEE Transactions on Electron Devices, vol. 64, No. 2, Feb. 2017, 7 pgs.

* cited by examiner

CO-DEPOSITION OF TITANIUM AND SILICON FOR IMPROVED SILICON GERMANIUM SOURCE AND DRAIN CONTACTS

BACKGROUND

In transistor applications, contact resistance at the interface between source and drain materials and metal source and drain contacts, respectively, is an important characteristic that is directly related to transistor performance and the clock frequency attainable by devices that employ the transistors. Furthermore, for epitaxial silicon germanium (SiGe) source and drain structures, high temperature processing after contact by the metal source and drain can cause inter-diffusion that, in turn, can cause voids in the epitaxial SiGe. Such voids can lead to device failure and other problems.

It is desirable to provide source and drain contacts with reduced contact resistance and greater reliability. It is with respect to these and other considerations that the present improvements have been needed. Such improvements may become critical to improve transistors for higher performance integrated circuit in electronic devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
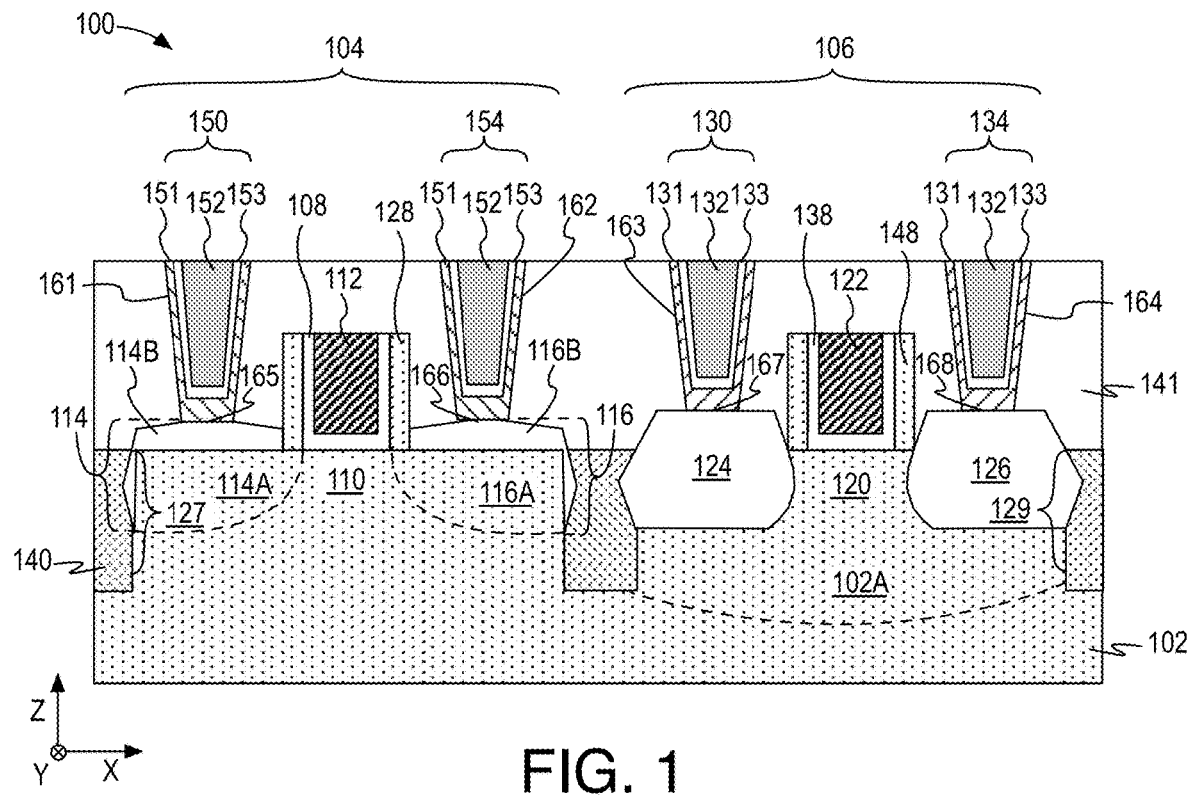
FIG. 1 is an illustration of a cross-sectional side view of a transistor structure having source and drain contacts including a co-deposited titanium and silicon layer.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistor structures, device structures, apparatuses, integrated circuits, computing platforms, and methods are described herein related to source and drain contact to source and drain interfaces and, in particular, to contacts having a co-deposited titanium and silicon layer on a silicon germanium source and drain for improved contact resistance and reliability.

As described above, contact resistance at the interface between source and drain materials and source and drain contacts is an important transistor characteristic. In particular, contacting boron doped epitaxial silicon germanium (SiGe) source and drain structures of PMOS (p-channel metal oxide semiconductor) devices and subsequent high temperature processing provides difficulties due to voids in the epitaxial SiGe and other concerns. As discussed herein, to provide improved contact resistance and to eliminate or greatly reduce voids in the epitaxial SiGe source and drains, titanium and silicon are co-deposited on the epitaxial SiGe. As used herein, the term co-deposited indicates the materials are deposited contemporaneously (e.g., in the process and process chamber). The titanium and silicon may be co-deposited at any suitable concentrations with 1:1 titanium to silicon (e.g., co-deposition of titanium monosilicide) being particularly advantageous.

Such a layer of titanium and silicon does not degrade post deposition during high temperature processing (e.g., 350-450° C. processing for one to two hours, 425-525° C. processing for one to several minutes, and similar high temperature processing). Furthermore, the discussed titanium and silicon layer is compatible with NMOS (n-channel metal oxide semiconductor) source and drain materials such as phosphorous doped epitaxial silicon. Therefore, the titanium and silicon layer may be used in both PMOS contacts on, for example, boron doped epitaxial SiGe and NMOS contacts on, for example, phosphorous doped silicon. Such PMOS contacts, NMOS contacts, or both may include the titanium and silicon layer (inclusive of any material that diffuse into the layer as discussed further herein) and additional materials such as a layer of titanium and nitrogen (e.g., a titanium nitride adhesion layer) and a fill material such as cobalt, tungsten, or others. Such contacts have low contact resistance (e.g., less than 2e-9 Ohm-cm$^2$) and a stabilized layer at the contact to source or drain interface that does not void the epitaxial SiGe source and drain.

FIG. 1 is an illustration of a cross-sectional side view of a transistor structure 100 having source and drain contacts including a co-deposited titanium and silicon layer, arranged in accordance with at least some implementations of the present disclosure. As shown, transistor structure 100 includes an NMOS transistor structure 104 and a PMOS transistor structure 106. Although illustrated adjacent to one another, NMOS transistor structure 104 and PMOS transistor structure 106 may be formed in any positions in transistor structure 100. NMOS transistor structure 104 and PMOS transistor structure 106 are formed over and on a substrate 102. In some embodiments, as illustrated, NMOS transistor structure 104 and PMOS transistor structure 106 are multi-gate transistor structures formed over and on fin structure 127 and fin structure 129, respectively, with fin structures 127, 129 extending in the x-direction. Furthermore, such multi-gate transistor structures may include wrap around gate structures and/or source and drain structures. A dielectric material 140 may separate fin structures 127, 129. In other embodiments, NMOS transistor structure 104 and PMOS transistor structure 106 are planar transistors. For example, a channel region 110 of NMOS transistor structure 104 may be within fin structure 127 and a channel region 120 of PMOS transistor structure 106 may be within fin structure 127 (and within an n-well 102A) such that channel regions 110, 120 are a part of a multi-gate transistor or such that channel regions 110, 120 are part of a planar transistor. As used herein, the term multi-gate transistor indicates a transistor having a gate that is adjacent to multiple surfaces of a channel region and is inclusive of tri-gate devices, dual gate devices, FinFETs, etc. The term gate-all-around indicates a transistor structure having a gate that surrounds one or more channel regions, with the one or more channel regions optionally being characterized as nano-wires, nano-sheets or the like. Such transistor structures are further discussed herein with respect to FIGS. 5 and 6. Notably, the source and drain to contact interfaces discussed herein may be employed in any transistor device architecture.

As discussed, NMOS transistor structure 104 and PMOS transistor structure 106 are formed over and on a substrate 102. Substrate 102 may include any suitable material and, in some embodiments, substrate 102 has the same or a similar composition with respect to channel regions 110, 120. In some embodiments, substrate 102 and channel regions 110, 120 include a Group IV material (e.g., silicon). In some embodiments, substrate 102 and channel regions 110, 120 include a substantially monocrystalline material. In some embodiments, substrate 102 includes a buried insulator layer (e.g., SiO$_2$), for example, of a semiconductor-on-insulator (SOI) substrate.

In the illustrated embodiment, PMOS transistor structure 106 includes a source 124 (or source region) and a drain 126 (or drain region) such that channel region 120 is between source 124 and drain 126. In some embodiments, source 124 and drain 126 are epitaxial silicon geranium structures (e.g., epitaxial SiGe) that may include dopants such as boron or gallium. Herein, the term epitaxial indicates a substantially crystalline material. For example, a silicon-germanium alloy may be epitaxially grown from the crystalline structure of fin 129 or another crystalline seed material. PMOS transistor structure 106 further includes a gate structure coupled to channel region 120 with the gate structure including a gate dielectric layer 138 and a gate electrode 122 within sidewall spacers 148. Gate sidewall spacers 148 may be any suitable materials such as dielectric materials inclusive of silicon nitride. Gate dielectric layer 138 may include a dielectric material or material stack inclusive of, for example, hafnium and oxygen (e.g., hafnium oxide) and/or other materials. For example, gate dielectric layer 138 may have a thickness in the range of about 0.8 to 2.5 nm. In some embodiments, gate electrode 112 includes a work function layer in contact with gate dielectric layer 138 and a fill metal above the work function layer. For example, the work function layer may be an elemental layer, a metal alloy layer, or a laminate structure including one or more of hafnium, zirconium, titanium, tantalum, aluminum, or carbon, with the fill metal including, for example, tantalum, or tungsten.

Similarly, NMOS transistor structure 104 includes a source 114 (or source region) and a drain 126 (or drain region) such that channel region 110 is between source 114 and drain 116. NMOS transistor structure 104 further includes a gate structure coupled to channel region 110 with the gate structure including a gate dielectric layer 108 and a gate electrode 112 within sidewall spacers 128. Gate dielectric layer 108, gate electrode 112, and sidewall spacers 128 may have any characteristics discussed with respect to gate dielectric layer 138, gate electrode 122, and sidewall spacers 148. In the illustrated embodiment, source 114 includes a doped epitaxial structure 114B on a doped region 114A of fin 127 and drain 116 includes a doped epitaxial structure 116B on a doped region 116A of fin 127. In some embodiments, fin 127 is monocrystalline silicon, doped regions 114A and 116A include n-type source and drain dopants such as phosphorus or arsenic, and doped epitaxial structure 114B, 116B include one or more of silicon, carbon, and phosphorous. Although illustrated with respect to source 114 including doped region 114A and doped epitaxial structure 114B and drain 116 including doped region 116A and doped epitaxial structure 116B, other alternatives are available. In some embodiments, source 114 and drain 116 are absent doped epitaxial structures 114B, 116B. In some embodiments, source 114 and drain 116 include phosphorus doped epitaxial silicon.

Notably, a contact layer 151 of source contact 150 and drain contact 154 may land on a phosphorus doped silicon material of source 114 and drain 116, for example. As used herein, the term contact layer indicates a layer having a least a portion thereof that is in direct contact with (e.g., on) a source or drain absent any intervening layer therebetween. In some embodiments, contact layer 151 includes titanium and silicon. In some embodiments, contact layer 151 is titanium silicide. In some embodiments, contact layer 151 includes titanium, silicon, and a material that diffused into contact layer 151 during thermal processing. As discussed herein, in some embodiments, contact layer 151 is co-deposited titanium and silicon, which may subsequently undergo thermal anneal or other thermal processing.

As shown, contact layer 151 of source contact 150 is on a portion 165 of source 114 and contact layer 151 of source contact 150 extends at least partially along a sidewall 161 of a dielectric layer 141 that at least partially encapsulates components of NMOS transistor structure 104. In the illustrated embodiment, contact layer 151 extends along a full length of sidewall 161. Similarly, contact layer 151 of drain contact 154 is on a portion 166 of drain 116 and contact layer 151 of drain contact 154 extends at least partially along a sidewall 162 of dielectric layer 141. In some embodiments, each of source contact 150 and drain contact 154 further includes a layer 153 (e.g., an adhesion layer) on or over contact layer 151, and a fill metal 152 on or over layer 153. In some embodiments, layer 153 includes titanium and nitrogen. For example, layer 153 may be a titanium nitride layer. Fill metal 152 may include any suitable conductor such as, for example, cobalt or tungsten.

Turning to PMOS transistor structure 106, in some embodiments, source 124 and drain 126 of PMOS transistor structure 106 include epitaxial structures grown from etched regions of fin 129. In other embodiments, source 124 and drain 126 of PMOS transistor structure 106 may be formed from doped or undoped regions of fin 129 in a manner similar to that shown with respect to NMOS transistor structure 104, although etch and epitaxial growth structures as shown may be advantageous due to providing strain in channel region 120, higher purity of silicon germanium, greater drive currents, and other advantages. Notably, contact layer 131 of source contact 130 and drain contact 134 lands on an epitaxial silicon germanium material of source 124 and drain 126 such as boron doped epitaxial silicon germanium source and drain materials.

The epitaxial silicon germanium material of source 124 and drain 126 (e.g., a source and drain each including silicon and germanium) may include silicon and germanium at any suitable concentrations and inclusive of dopants. In an embodiment, the epitaxial silicon germanium material is substantially equal parts silicon and germanium. In some embodiments, source 124 and drain 126 are substantially equal parts silicon and germanium throughout a thickness (e.g., in the z dimension) thereof, however material gradients may be employed and, as discussed, source 124 and drain 126 may be doped.

In some embodiments, contact layer 131 includes titanium and silicon. In some embodiments, contact layer 131 is titanium silicide. In some embodiments, contact layer 131 includes titanium, silicon, and a material that diffused into contact layer 131 during thermal processing. In some embodiments, contact layer 151 is co-deposited titanium and silicon, which may subsequently undergo thermal anneal or other thermal processing. In some embodiments, germanium from the silicon germanium material of source 124 and drain 126 diffuses into contact layer 131 during such thermal processing with the germanium being at a relatively low concentration. In some embodiments, contact layer 131 includes titanium, silicon, and germanium. In some embodiments, contact layer 131 includes titanium, silicon, and germanium with the germanium concentration of not more than 10%. In some embodiments, contact layer 131 includes titanium, silicon, and germanium with the germanium concentration of not more than 5%. In some embodiments, contact layer 131 includes titanium, silicon, and germanium with the germanium concentration of not more than 2.5%. In some embodiments, contact layer 131 may be characterized as a titanium germanosilicide. In some embodiments, the titanium germanosilicide may have a germanium concentration of less than 10%, less than 5%, or less than 2.5%. Furthermore, due to the contact layer 131 being formed by co-deposition of titanium and silicon, contact layer 131 may be free of unwanted dopants or materials such as boron. In some embodiments, contact layer 131 is absent boron.

Contact layer 131 of source contact 130 is on a portion 167 of source 124 and contact layer 131 of source contact 130 extends at least partially along a sidewall 163 of dielectric layer 141, In a similar manner, contact layer 131 of drain contact 134 is on a portion 168 of drain 126 and contact layer 131 of drain contact 134 extends at least partially along a sidewall 164 of dielectric layer 141. In some embodiments, each of source contact 130 and drain contact 134 further includes a layer 133 (e.g., an adhesion layer) on or over contact layer 131, and a fill metal 132 on or over layer 133. In some embodiments, layer 133 includes titanium and nitrogen. For example, layer 133 may be a titanium nitride layer. Fill metal 132 may include any suitable conductor such as, for example, cobalt or tungsten.

In some embodiments, contact layers 131, 151 are disposed or formed simultaneously with one another, layers 133, 153 are disposed or formed simultaneously with one another, and fill metals 132, 152 are disposed or formed simultaneously with one another as discussed with respect to FIGS. 4B-4G. In such embodiments, layers 131, 151 may include substantially the same or similar materials, layers 133, 153 may include substantially the same or similar materials, and fill metals 132, 152 may include substantially the same or similar materials. In other embodiments, one or more or such material may differ between PMOS transistor structure 106 and NMOS transistor structure 104.

Figure 2:
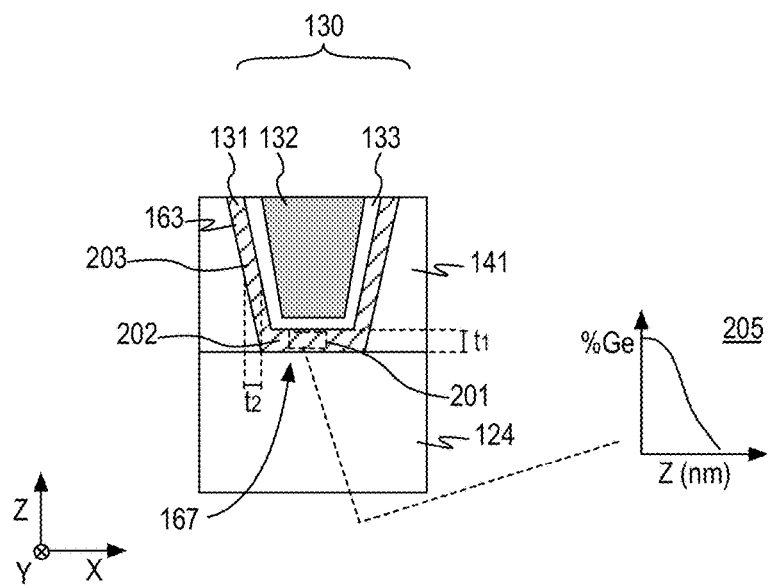
FIG. 2 is an illustration of a cross-sectional side view of a portion of the transistor structure of FIG. 1 including a close up of a source contact thereof.

FIG. 2 is an illustration of a cross-sectional side view of a portion of transistor structure 100 including a close up of source contact 130, arranged in accordance with at least some implementations of the present disclosure. The characteristics of source contact 130 discussed with respect to FIG. 2 may also occur in drain contact 134. Furthermore, applicable characteristics of source contact 150 and drain contact 154 may also be shared with those discussed with respect to source contact 130 in FIG. 2. As shown in FIG. 2, contact layer 131 has a portion 202 that is in contact with portion 167 of source 124. Furthermore, contact layer 131 has a portion 203 that is in contact with and extends along sidewall 163 of dielectric layer 141.

In the illustrated example, source contact 130 has a substantially trapezoidal cross section, however source contact may be substantially square in cross section, substantially rectangular in cross section, or the like, although in practice sharp corners, perfectly conformal shapes, and the like are not attainable. At portion 202, contact layer 131 has a z-dimensional thickness, $t_1$, which may be measured at a point in portion 202, as an average of several measurement points in portion 202, or the like. Thickness $t_1$ may be any suitable thickness. In some embodiments, thickness $t_1$ is in the range of 2 to 10 nm. In some embodiments, thickness $t_1$ is not more than 10 nm. In some embodiments, thickness $t_1$ is not more than 8 nm. In some embodiments, thickness $t_1$ is not more than 6 nm.

Furthermore, at portion 203, contact layer 131 has a x-dimensional thickness, $t_2$, which may be measured at a point in portion 203, as an average of several measurement points in portion 203, or the like. Thickness $t_2$ may be any suitable thickness. In some embodiments, thickness $t_2$ is in the range of 2 to 10 nm. In some embodiments, thickness $t_2$ is not more than 10 nm. In some embodiments, thickness $t_2$ is not more than 8 nm. In some embodiments, thickness $t_2$ is not more than 6 nm. In some embodiments, thicknesses $t_1$, $t_2$ are substantially the same. For example, thicknesses $t_1$, $t_2$ may differ by not more than 10%. In some embodiments, thicknesses $t_1$, $t_2$ differ by not more than 5%. In some embodiments, thicknesses $t_1$, $t_2$ differ by not more than 2%. Examples of thicknesses $t_1$, $t_2$ being substantially the same may be attained in the context of the co-deposition of titanium and silicon of contact layer 131 being performed using chemical vapor deposition (CVD) techniques.

In other examples, thickness $t_1$ is greater than thickness $t_1$ such that, during the co-deposition of contact layer 131, the bottom of an opening in dielectric layer 141 is covered to a greater extent than the sidewalls of the opening. Such examples may be attained in the context of the co-deposition of the titanium and silicon of contact layer 131 being performed using physical vapor deposition (PVD) techniques. In some embodiments, thickness $t_1$ is not less than 1.1 times thickness $t_2$. In some embodiments, thicknesses $t_1$ is not less than 1.25 times thickness $t_2$. In some embodiments, thicknesses $t_1$ is not less than 1.5 times thickness $t_2$.

In some embodiments, subsequent to the co-deposition of the titanium and silicon of contact layer 131, thermal processing is performed. Such thermal processing may provide for diffusion between contact layer 131 in portion 202 and the silicon germanium material of source 124 in portion 167. Notably, germanium may diffuse into contact layer 131 such that contact layer 131 has a low germanium concentration as discussed above. For example, contact layer 131 may have a germanium concentration of than 10%, less than 5%, or less than 2.5%. Such germanium concentration may be measured within a volume of portion 202, as an average of the germanium concentration in several values within portion 202, or the like.

Furthermore, as shown in germanium concentration profile 205 with respect to sample region 201, the germanium concentration in portion 167 of contact layer 131 may vary along the z-axis (e.g., along a depth of portion 167) such that the concentration of germanium monotonically decreases within portion 202 from a maximum concentration at or near the interface to portion 167 to a low or minimum concentration at or near an interface to layer 133. As shown, in some embodiments, the concentration of germanium may decrease less rapidly at or near the interface to portion 167 and more rapidly away from the interface to portion 167. In some embodiments, the concentration of germanium may decrease in a substantially linear manner.

As discussed, contact layer 131, including co-deposited titanium silicon, of source contact and drain contact 134 is in direct contact with source 124 and drain 126. Such direct contact of co-deposited titanium silicon on the epitaxial silicon germanium mater of source 124 and drain 126 provides stability of the titanium and silicon germanium (Ti/SiGe) interface therebetween. Notably, in subsequent thermal processing as discussed below, no voids are formed in the epitaxial silicon germanium mater of source 124 and drain 126. Elimination of such voids eliminates or reduces shorts, locations of increased contact resistance, and other issues for improved stability, reliability, and contact resistance in PMOS transistor structure 106.

Furthermore, contact layer 151, also including co-deposited titanium silicon, may be advantageously employed in source contact 150 and drain contact 154 in NMOS transistor structure 104. As discussed, source 114 and drain 116 may be phosphorous doped silicon and, due to the thermal processing contact layer 151 may include trace concentrations (e.g., <1%) of phosphorous. Such sharing of the material of contact layers 131, 151, as well as layers 133, 153 and fill metals 132, 152 provides for fewer fabrication operations, greater efficiency, and higher yields.

Figure 3:
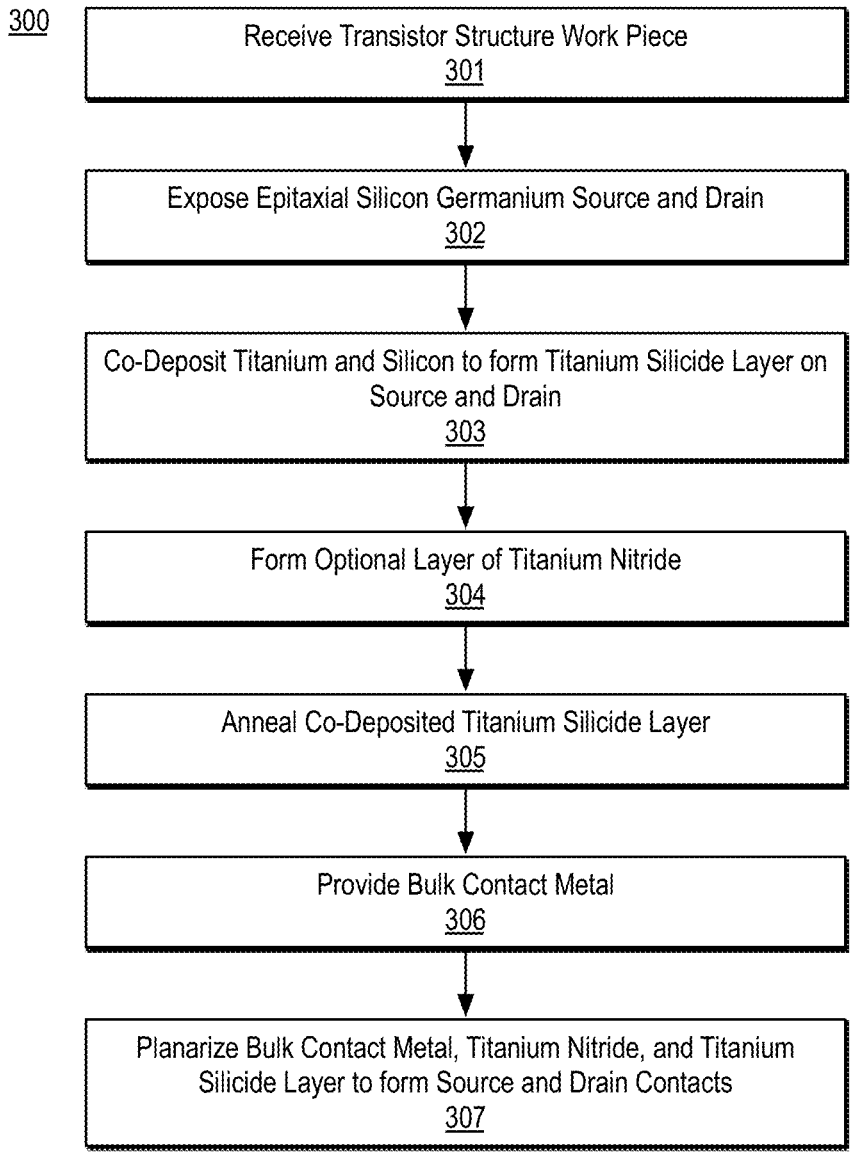
FIG. 3 illustrates a flow diagram illustrating an example process for fabricating transistor structures.

FIG. 3 illustrates a flow diagram illustrating an example process 300 for fabricating transistor structures, arranged in accordance with at least some implementations of the present disclosure. For example, process 300 may be implemented to fabricate transistor structure 100 or any other transistor structure discussed herein. In the illustrated embodiment, process 300 includes one or more operations as illustrated by operations 301-307. However, embodiments herein may include additional operations, certain operations being omitted, or operations being performed out of the order provided. In an embodiment, process 300 may fabricate transistor structure 470 as discussed further herein with respect to FIGS. 4A-4H. In an embodiment, process 300 may fabricate transistor structure 500 as discussed further herein with respect to FIGS. 5 and 6.

Process 300 begins at operation 301, where a transistor structure work piece is received for processing. For example, NMOS and PMOS transistor structures may be formed on and over a substrate. The substrate may include any suitable substrate such as a silicon wafer or the like. The NMOS and PMOS transistor structures may be planar, multi-gate, or gate all around transistor structures formed using techniques known in the art. The PMOS transistor structure includes a channel region between a source region and a drain region such that the source and drain region include silicon and germanium such as an epitaxial silicon germanium source and drain. Furthermore, a gate structure is adjacent the channel region (or regions in the case of some gate all around devices) and includes a gate electrode (a single material or stack of materials) separated from the channel region by a gate dielectric (a single dielectric material or a stack of such materials). The gate electrode and the source and drain regions are electrically isolated by a sidewall spacer and/or a dielectric layer. The dielectric layer may also cover the gate electrode, source region, and drain region.

Similarly, the NMOS transistor structure includes a channel region between a source region and a drain region. The source and drain regions may include any suitable materials. In some embodiments, the NMOS transistor structure source and drain regions include silicon and phosphorous such as a phosphorus doped silicon. A gate structure is adjacent the channel region (or regions for some gate all around devices). The gate structure includes a gate electrode (a single material or stack of materials) separated from the channel region by a gate dielectric (a single dielectric material or a stack of such materials) with the gate electrode and the source and drain regions being electrically isolated by a sidewall spacer and/or a dielectric layer, which may also cover the gate electrode, source region, and drain region.

Processing continues at operation 302, where the epitaxial silicon germanium source and drain of the PMOS transistor structure are exposed. The source and drain regions of the PMOS transistor structure may be exposed using any suitable technique or techniques such as lithography and etch techniques. In some embodiments, the source and drain regions of the NMOS transistor structure are exposed using the same process. Furthermore, the gate electrode may be exposed and contacted using the same processing or processing performed before or after contacting the source and drain regions of the PMOS transistor structure and/or the source and drain regions of the NMOS transistor structure.

Processing continues at operation 303, where a layer of titanium and silicon are co-deposited. The co-deposited titanium and silicon are formed on exposed regions or portions of the source and drain regions of the PMOS transistor structure and, optionally, on the source and drain regions of the NMOS transistor structure and/or the gate electrodes of the PMOS and NMOS transistor structures. As discussed, the co-deposited titanium and silicon are formed simultaneously in the same process. The co-deposited titanium and silicon may form a titanium silicide film, for example. The co-deposited titanium and silicon may have any proportions of titanium and silicon. In some embodiments, the co-deposited titanium and silicon has substantially 50% titanium and 50% silicon such that a titanium monosilicide (1:1) is formed.

The co-deposited titanium and silicon or titanium silicide film or layer may be formed using any suitable technique or techniques. In some embodiments, the layer is formed using PVD techniques. In some embodiments, the layer is formed using CVD techniques. In embodiments where PVD is employed, the bottom of the opening in which the layer is formed has a substantially greater thickness than the thickness along sidewalls of the opening. In embodiments where CVD is employed, the bottom of the opening and the sidewalls will have substantially the same thickness (e.g., the layer will be more conformal). In either case, the processing provides for a substantially pure layer of titanium and silicon that is advantageously absent unwanted dopants materials such as boron or others. The thickness of the co-deposited titanium and silicon or titanium silicide film or layer may be any suitable thickness on the source and/or drain. In some embodiments, the thickness on the source and/or drain is in the range of 2 to 10 nm with the corresponding thickness along the sidewall being less (in the case of PVD) or substantially the same (in the case of CVD). In some embodiments, the thickness of the co-deposited titanium and silicon layer on the source and/or drain is about 5 nm. In some embodiments, the thickness of the co-deposited titanium and silicon layer on the source and/or drain is about 6 nm. In some embodiments, the thickness of the co-deposited titanium and silicon layer on the source and/or drain is about 8 nm.

Processing continues at operation 304, where an optional layer of titanium and nitrogen such as a titanium nitride film or layer is formed on the co-deposited titanium and silicon layer. For example, a titanium nitride film may provide an adhesion layer for a subsequent bulk metal fill of the source and drain contacts. The layer of titanium and nitrogen may be formed using any suitable technique or techniques such as PVD or CVD techniques. The layer of titanium and nitrogen may have any thickness such as a thickness in the range of 2 to 5 nm. In some embodiments, the layer of titanium and nitrogen has a thickness of about of 2 nm.

Processing continues at operation 305, where the co-deposited titanium silicide film or layer (and the optional layer of titanium and nitrogen, if employed) is annealed or heat treated. It is noted such anneal processing may be performed immediately after the co-deposition of titanium and silicon, after a layer of titanium and nitrogen is deposited, or later in the process flow. The anneal processing may include any processing at an elevated temperature above 350° C. or above 400° C. In some embodiments, the anneal processing includes processing in the range of 350-450° C. for a duration in the range of one to two hours. For example, an anneal at about 450° C. for about one hour may be used. In some embodiments, the anneal processing includes processing in the range of 425-525° C. processing for one to three minutes. For example, an anneal at about 525° C. for about one minute may be used. Other anneal temperatures and durations or combinations thereof may be employed.

During such anneal processing, diffusion into (and out of) the co-deposited titanium silicide may occur. In particular, germanium from the PMOS source or drain may diffuse into the substantially pure titanium silicide layer to provide a low level concentration of germanium in the film or layer. In some embodiments, the resultant contact layer includes titanium, silicon, and germanium with a germanium concentration of not more than 10%. In some embodiments, the resultant contact layer includes titanium, silicon, and germanium with a germanium concentration of not more than 5%. In some embodiments, the resultant contact layer includes titanium, silicon, and germanium with a germanium concentration of not more than 2.5%.

Processing continues at operation 306, where a bulk contact metal is formed on or over the titanium nitride layer or on or over the titanium silicide layer to fill the source and drain contacts. The bulk contact metal may include any metal or metals. In some embodiments, the bulk contact metal includes cobalt. In some embodiments, the bulk contact metal includes cobalt. The bulk contact metal may be formed using any suitable technique or techniques Processing continues at operation 307, where a planarization operation is performed to remove portions of the bulk contact metal, titanium nitride, and the titanium silicide layer (or titanium germanosilicide layer) are removed to form the source and drain contacts. For example, the planarization may remove portions from a top surface of a dielectric layer while leaving portions in vias in the dielectric layer such that the resultant source and drain contacts include a contact layer including silicon, titanium, and diffused material (e.g., germanium for a PMOS transistor structure), a layer including titanium and nitrogen, and a bulk metal fill (e.g., including one or more fill metals).

Figure 4A:
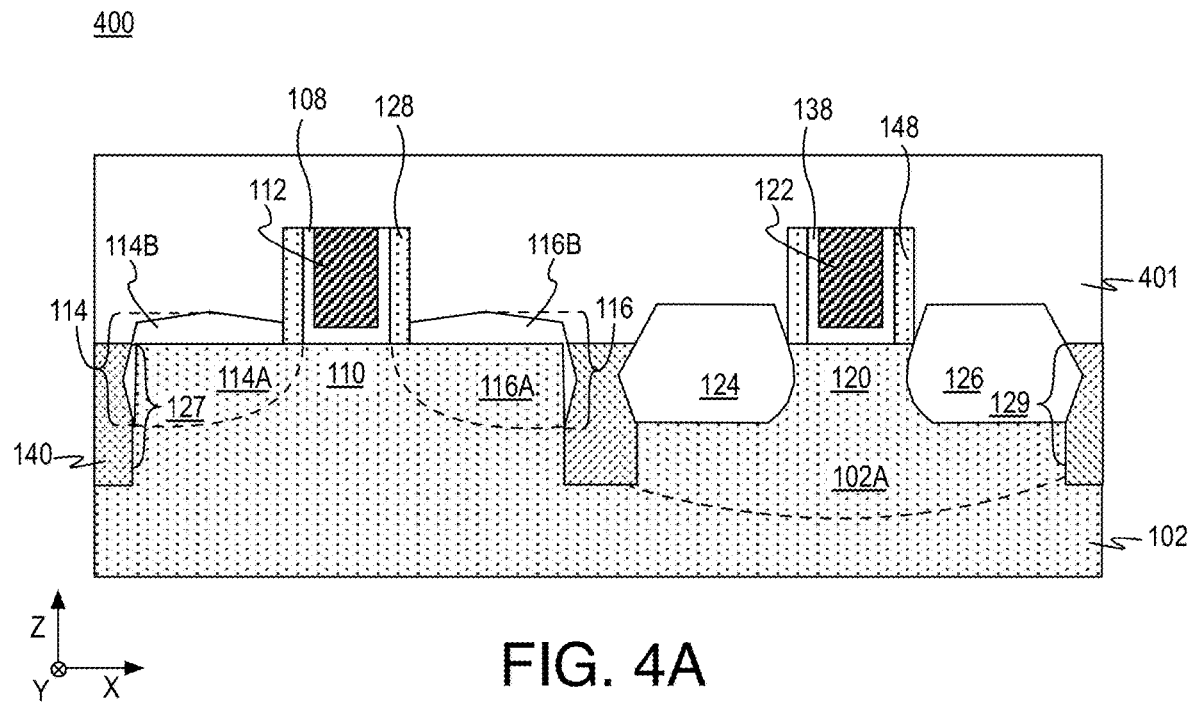
FIGS. 4A, 4B, 4C, 4D, 4E, 4F, 4G, and 4H illustrate cross-sectional side views of example transistor structures as particular fabrication operations are performed.

FIGS. 4A, 4B, 4C, 4D, 4E, 4F, 4G, and 4H illustrate cross-sectional side views of example transistor structures as particular fabrication operations are performed, arranged in accordance with at least some implementations of the present disclosure. As shown in FIG. 4A, a transistor structure 400 (or work piece) is received for processing as discussed with respect to operation 301. Like numerals in FIG. 4 previously discussed herein may share any characteristics as described. For example, transistor structure 400 includes substrate 102, fin 127 and fin 129 separated by dielectric material 140. Fin 127 includes channel region 110 separating source 114 and drain 116. A gate structure including gate electrode 112, gate dielectric layer 108, and sidewall spacers 128 is provided adjacent channel region 110. Similarly, fin 129 includes channel region 120. Channel region 120 is between source 124 and drain 126. A gate structure including gate electrode 122, gate dielectric layer 138, and sidewall spacers 148 is provided adjacent channel region 110. Also, as shown in FIG. 4A, a dielectric layer 401 is provided over source 114, gate electrode 112, gate dielectric layer 108, sidewall spacers 128, drain 116, source 124, gate electrode 122, gate dielectric layer 138, sidewall spacers 148, and drain 126. For example, dielectric layer 401 may be a bulk unpatterned dielectric layer including, for example, silicon oxide.

Figure 4B:
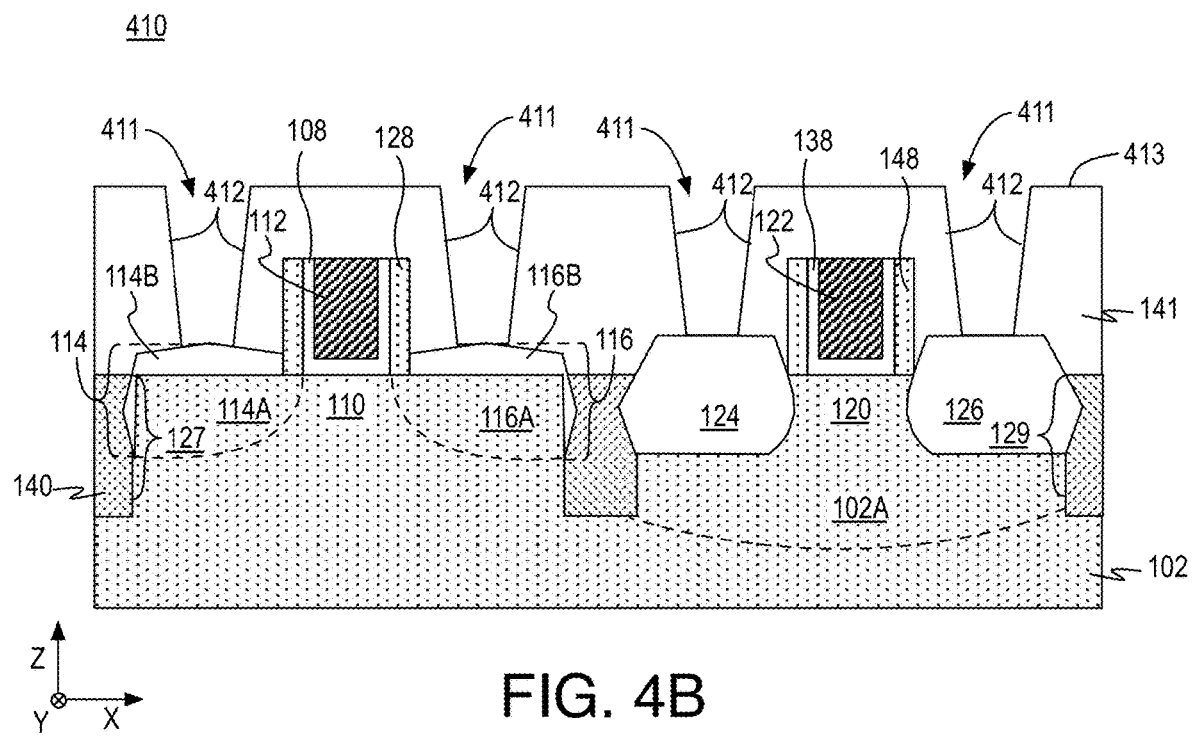

FIG. 4B illustrates a transistor structure 410 similar to transistor structure 400, after the formation of vias 411 in dielectric layer 401 to form dielectric layer 141. For example, vias 411 may be formed as discussed with respect to operation 302. As shown, in some embodiments, vias 411 provide access to source 114, drain 116, source 124, and drain 126. Such embodiments provide simplified fabrication with both NMOS and PMOS contacts being made during the same operations as the discussed contact layer including silicon and titanium is suitable for contact to both NMOS and PMOS source and drain transistor structures. However, in some embodiments, a contact layer including silicon and titanium may be used for PMOS transistor structures while other material(s) are used in NMOS transistor structures. For example, in some embodiments, vias 411 provide access to source 124 and drain 126 while source 114 and drain 116 may be contacted in subsequent (or prior) processing. Similarly, gate electrodes 112, 122 may be contacted by additional vias (not shown); however, gate contacts may advantageously be formed in subsequent (or prior) processing such that alternative materials may be employed.

Vias 411 may be formed using any suitable technique or techniques. In some embodiments, a photoresist layer is formed on (e.g., spun on) dielectric layer 401 and subsequently patterned using exposure techniques. The patterned photoresist layer is then used to transfer vias 411 (e.g., having a substantially circular cross section in the x-y plane in some examples) using etch techniques. The patterned photoresist layer is then removed. As shown, each of vias 411 includes a sidewall 412 that extends from a top surface 413 of dielectric layer 141 to the corresponding one of source 114, drain 116, source 124, or drain 126. Such sidewalls 412 may slope inwardly (e.g., leaving a larger opening at or near top surface 413 than at the corresponding one of source 114, drain 116, source 124, or drain 126) as shown or they may be substantially vertical (e.g., aligned with the z-axis). In some embodiments, sidewalls 412 are slightly concave. Although illustrated with respect to vias 411 being separated from sidewall spacers 128, 148, in some embodiments, vias 411 may partially impinge on sidewall spacers 128, 148 such that subsequently formed structures are adjacent sidewall spacers 128, 148. For example, a contact layer including titanium and silicon may be formed with a portion thereof on one or both of sidewall spacers 128, 148.

Figure 4C:
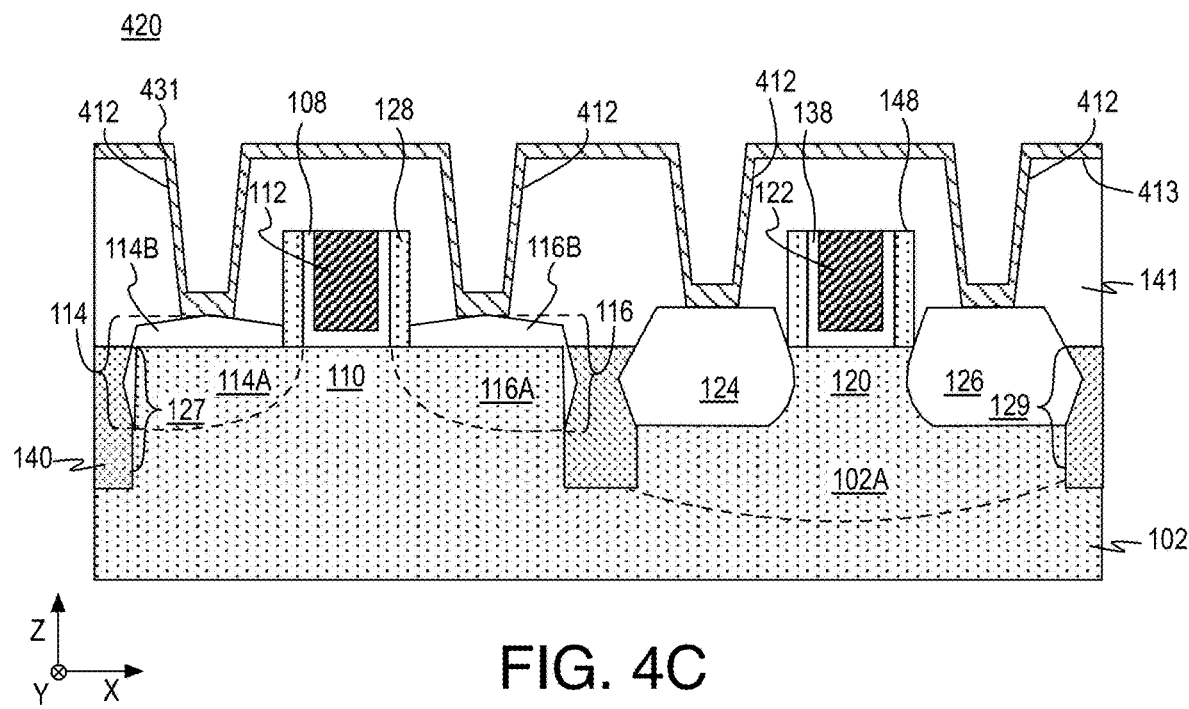

FIG. 4C illustrates a transistor structure 420 similar to transistor structure 410, after the co-deposition of a contact layer 431 that includes titanium and silicon. For example, contact layer 431 may be formed as discussed with respect to operation 303. For example, contact layer 431 is formed by deposition of titanium and silicon simultaneously. In some embodiments, contact layer 431 is a titanium silicide film or layer. Contact layer 431 may include any proportions of silicon and titanium. In some embodiments, contact layer 431 is 1:1 titanium and silicon such that contact layer is a titanium monosilicide film or layer. Contact layer 431 may be formed using any co-deposition techniques. In some embodiments, contact layer 431 is formed using PVD co-deposition. In such embodiments, a thickness of contact layer 431 on source 114, drain 116, source 124, and drain 126 is substantially greater than a thickness of contact layer 431 on sidewalls 412. In some embodiments, contact layer 431 is formed using CVD co-deposition. In such embodiments, a thickness of contact layer 431 on source 114, drain 116, source 124, and drain 126 is substantially equal to a thickness of contact layer 431 on sidewalls 412. The thickness of contact layer 431 on source 114, drain 116, source 124, and drain 126 may be any suitable thickness. In some embodiments, the thickness of contact layer 431 on source 114, drain 116, source 124, and drain 126 is in the range of 2 to 10 nm.

Figure 4D:
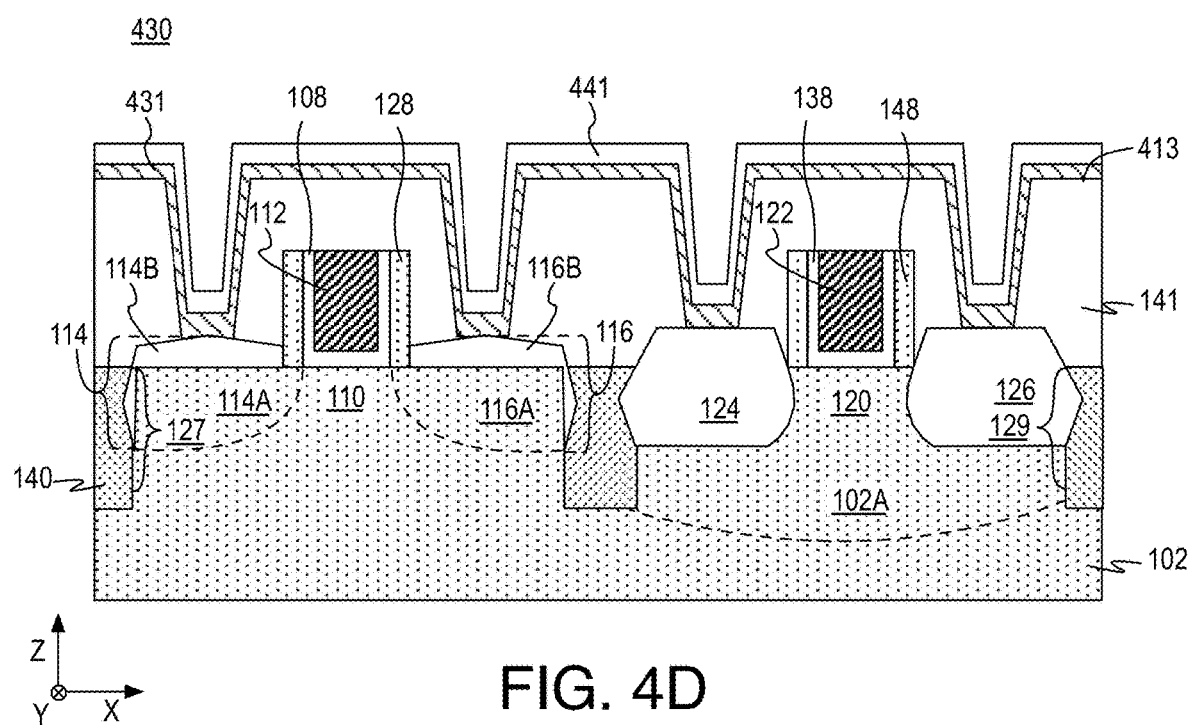

FIG. 4D illustrates a transistor structure 430 similar to transistor structure 420, after the deposition of an optional layer 441 such as an adhesion layer on or over contact layer 431. For example, layer 441 may be formed as discussed with respect to operation 304. In some embodiments, layer 441 includes titanium and nitrogen. For example, layer 441 may be a titanium nitride layer. Layer 441 may be formed using any suitable deposition techniques such as CVD or PVD. Layer 441 may have any suitable thickness such as a thickness of about 2 nm.

Figure 4E:
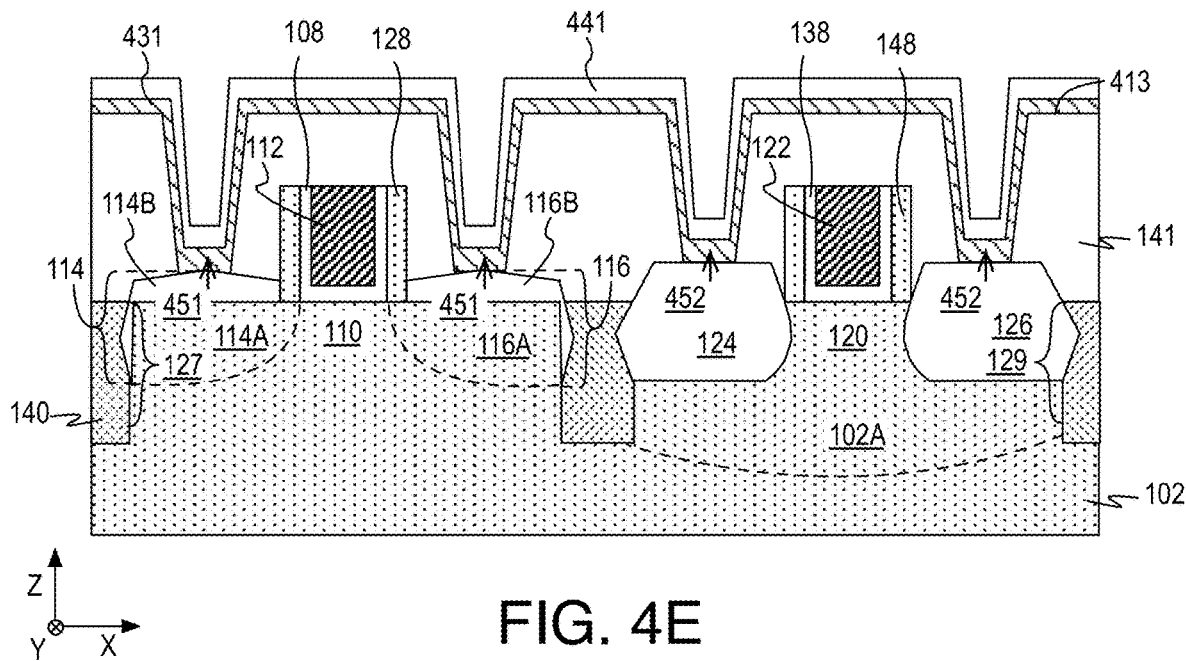

FIG. 4E illustrates a transistor structure 440 similar to transistor structure 430, after anneal processing that causes diffusion 451 into portions of contact layer 431 from source 114 and drain 116 and diffusion 452 into portions of contact layer 431 from source 124 and drain 126. For example, the anneal processing may be performed as discussed with respect to operation 305. Notably, diffusion 452 may cause diffusion of germanium from source 124 and drain 126 into local portions of contact layer 431 to provide a low level of germanium therein. In some embodiments, the germanium concentration is not more than 10% in the local portion of contact layer 431. In some embodiments, the germanium concentration is not more than 5% in the local portion of contact layer 431. In some embodiments, the germanium concentration is not more than 2.5% in the local portion of contact layer 431. Furthermore, diffusion 451 may cause diffusion of phosphorous from source 114 and drain 116 into local portions of contact layer 431 to provide trace levels (e.g., not more than 1%) in the local portion of contact layer 431.

Figure 4F:
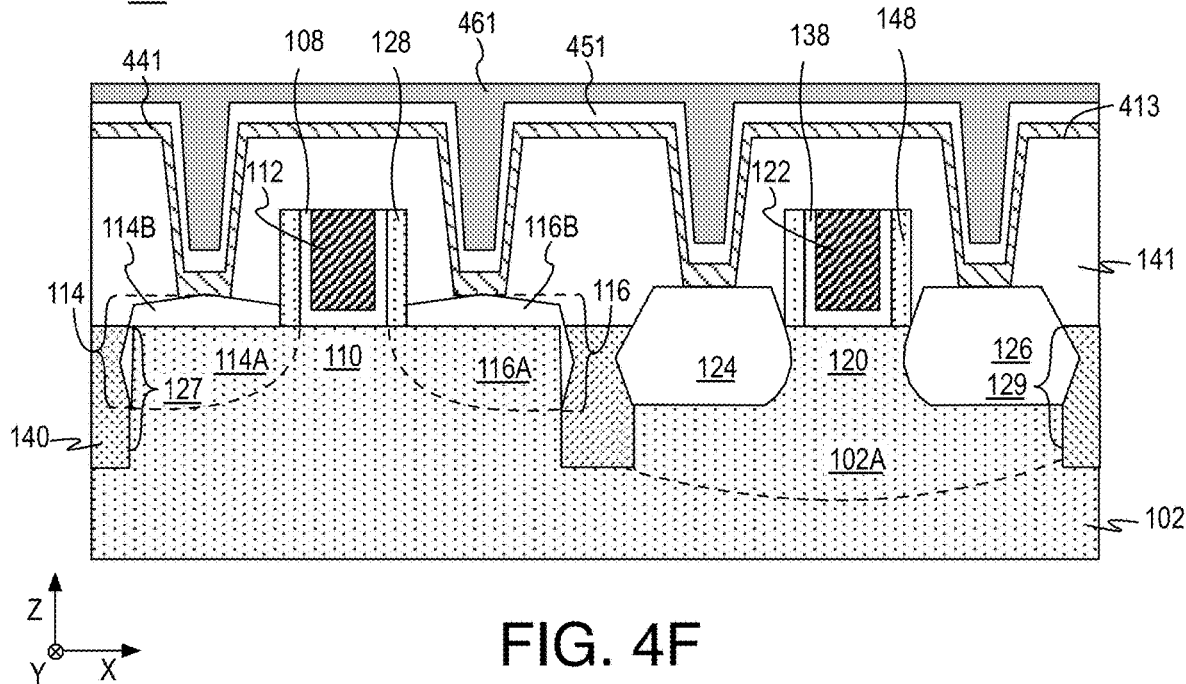

FIG. 4F illustrates a transistor structure 450 similar to transistor structure 440, after the deposition of a bulk metal fill layer 461. For example, metal fill layer 461 may be formed as discussed with respect to operation 306. Metal fill layer 461 may include any suitable conductive material or materials. In some embodiments, metal fill layer 461 is or includes cobalt. In some embodiments, metal fill layer 461 is or includes tungsten. Other conductors and/or fill metals may be employed. As shown, metal fill layer 461 fills the remainder of vias 411 (refer to FIG. 4B) and may cover (along with contact layer 431 and layer 441) top surface 413 of dielectric layer 141.

Figure 4G:
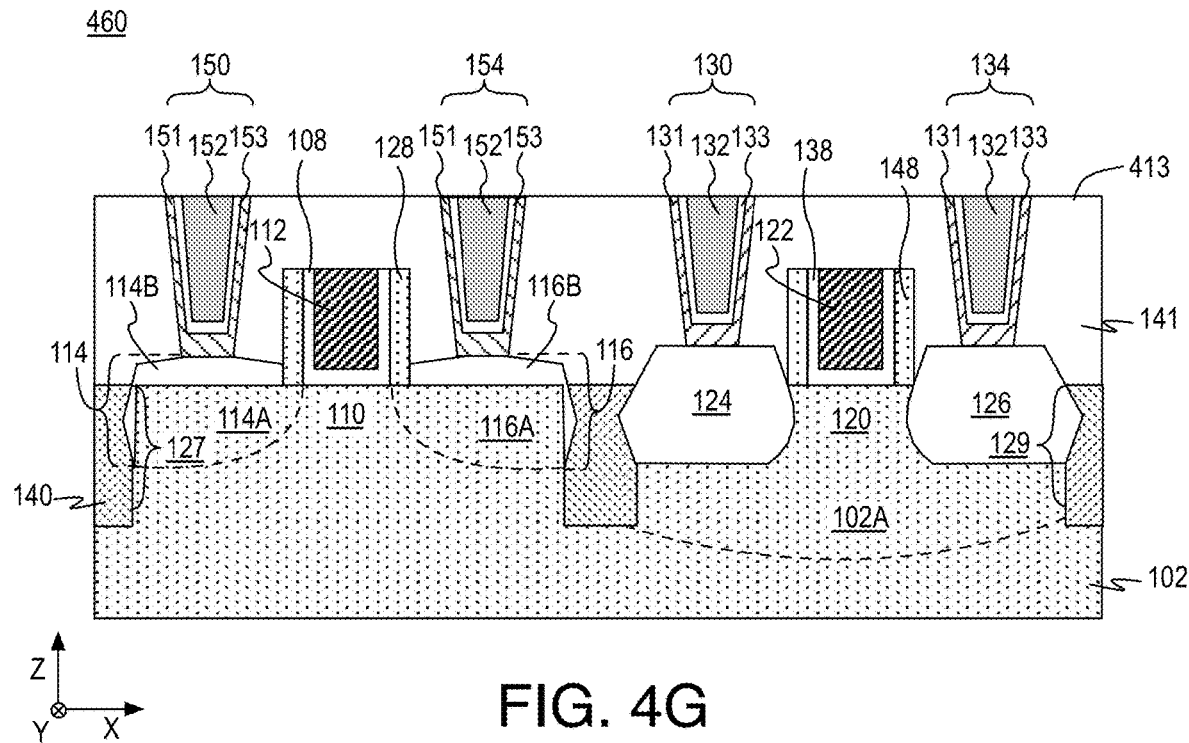

FIG. 4G illustrates a transistor structure 460 similar to transistor structure 450, after a planarization operation to remove portions of metal fill layer 461, layer 441, and contact layer 431 to provide source contact 150, drain contact 154, source contact 130, and drain contact 134 having any features discussed herein. The planarization operation may be performed using any suitable technique or techniques such as chemical mechanical polish techniques.

Figure 4H:
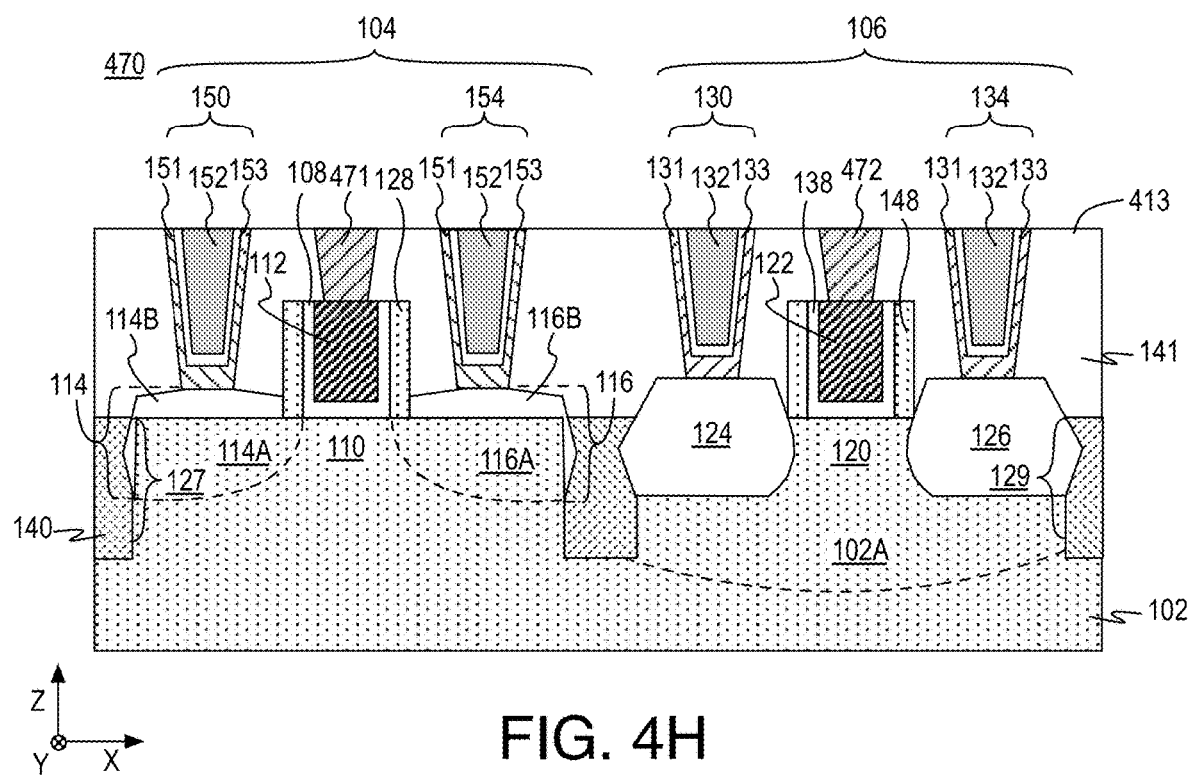

FIG. 4H illustrates a transistor structure 470 similar to transistor structure 460, after formation of gate contacts 471, 472. Gate contacts 471, 472 may be formed using any suitable technique or techniques such as lithography and etch techniques to form vias that expose portions of gate electrodes 112, 122, deposition of conductive material(s) and planarization operations. As discussed, in some embodiments, gate contacts 471, 472 are formed in conjunction with source contact 150, drain contact 154, source contact 130, and drain contact 134. In such embodiments, gate contacts may include a titanium silicide layer, a titanium nitride layer, and a fill meta of tungsten or cobalt as discussed with respect to source contact 150, drain contact 154, source contact 130, and drain contact 134.

As discussed, PMOS transistor structures include a contact layer (of a source/drain contact) including titanium and silicon in contact with a source or drain including silicon and germanium. The contact layer may include a relatively low concentration of germanium due to thermal processing. Furthermore, NMOS transistor structures may include a contact layer (of a contact) including titanium and silicon in contact with a source or drain. In the NMOS transistor structures, the source or drain may include any suitable material such as silicon doped with phosphorous. The contact layer of the NMOS transistor structure may also include a third material such as phosphorous in some examples. Such PMOS and/or NMOS transistor structures may be employed in any transistor architectures such as planar, multi-gate, or gate all around. Furthermore, such PMOS and/or NMOS transistor structures may be employed in any suitable devices. In the following, reference to an integrated circuit or device including a titanium and silicon (TiSi) contact layer (e.g., a contact layer including titanium and silicon) to a silicon and germanium (SiGe) S/D (source or drain material including silicon and germanium) contacts indicates the integrated circuit or device has a transistor structure having a channel region between a source and drain such that the source and drain each include silicon and germanium, a gate electrode adjacent to the channel region, and a contact comprising a contact layer on the source and/or drain such that the contact layer includes titanium and silicon, and optionally germanium at a low concentration. Such integrated circuits or devices may, in addition or in the alternative, include transistor structures having a second channel region between a second source and drain having any suitable material such as, for example, silicon and phosphorous, and a second contact including a second contact layer on the source or drain such that the second contact layer includes titanium and silicon.

Figure 5:
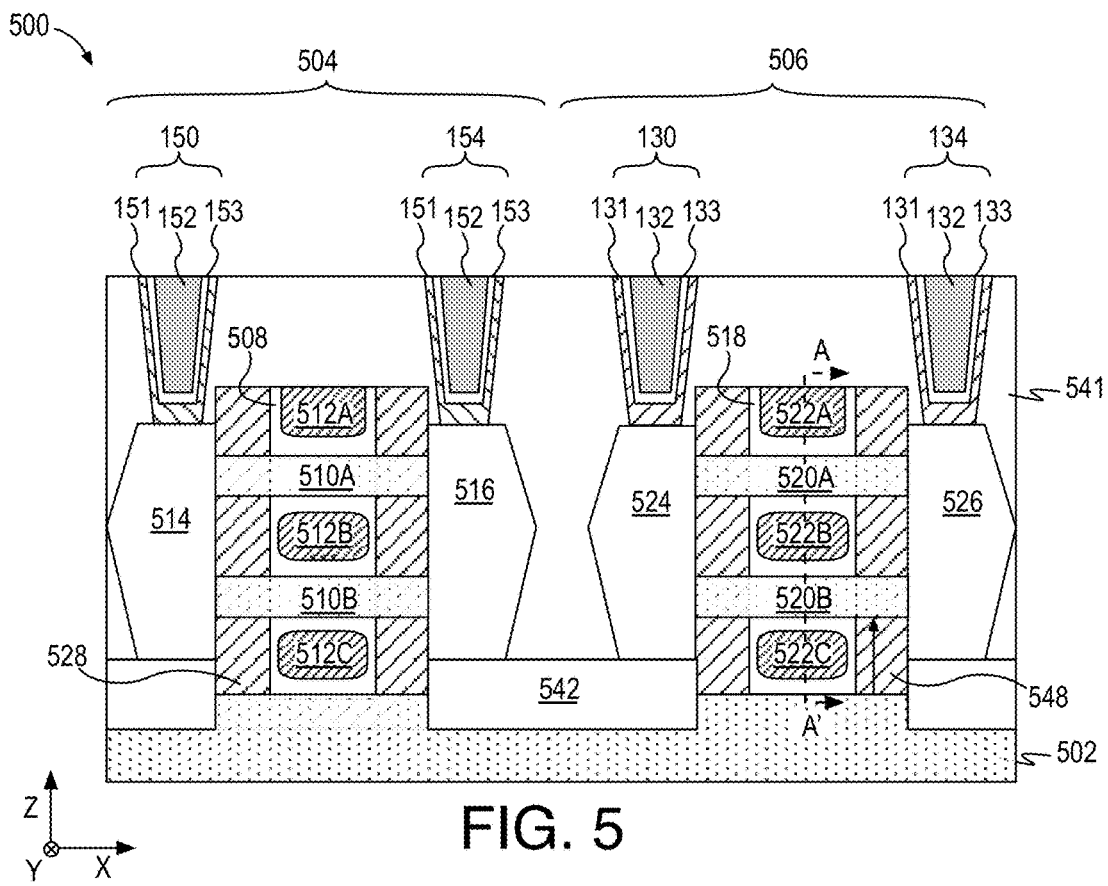
FIG. 5 is an illustration of a cross-sectional side view of a gate all around transistor structure including source and drain contacts including a co-deposited titanium and silicon layer.

FIG. 5 is an illustration of a cross-sectional side view of a gate all around (GAA) transistor structure 500 including source and drain contacts including a co-deposited titanium and silicon layer, arranged in accordance with at least some implementations of the present disclosure. As shown, GAA transistor structure 500 includes an NMOS GAA transistor structure 504 and a PMOS GAA transistor structure 506. NMOS GAA transistor structure 504 and PMOS GAA transistor structure 506 are formed over and on a substrate 502, which may have any characteristics discussed with respect to substrate 102.

PMOS GAA transistor structure 506 includes a source 524 (or source region) and a drain 526 (or drain region) with multiple channel regions 520A, B (e.g., 2, 3, 4 or more channel regions) therebetween. Portions of channel regions 520A, B may extend into source 524 and/or drain 526. In some embodiments, source 524 and drain 526 are epitaxial silicon geranium structures (e.g., epitaxial SiGe) having any characteristics discussed with respect to source 124 and drain 126. PMOS GAA transistor structure 506 further includes a gate structure coupled to channel regions 520A, B with a shared gate electrode 522, which may have any characteristics discussed with respect to gate electrodes 112, 122, having regions 522A, B, C, separated from channel regions 520A, B by a gate dielectric 518, which may have any characteristics discussed with respect to gate dielectric layers 108, 138. For example, channel regions 520A, B may be nano-ribbons, nano-sheets, or wires extending through the gate structure such that each is surrounded by a portion of gate electrode 522 and operable under such portions. The gate structure also includes a spacer material 548, which may have any characteristics discussed with respect to gate sidewall spacers 148.

Similarly, NMOS GAA transistor structure 404 includes a source 514 (or source region) and a drain 526 (or drain region) such that channel regions 510A, B (e.g., 2, 3, 4 or more channel regions) are between source 514 and drain 516. NMOS GAA transistor structure 504 further includes a gate structure similar to that of PMOS GAA transistor structure 506 (and having any shared materials or characteristics) coupled to channel regions 510A, B with the gate structure including a shared gate electrode 512 including regions 512A, B, C, separated from channel regions 510A, B by a gate dielectric 508, and a gate spacer 528. In some embodiments, source 514 and drain 516 includes a doped silicon material such as silicon doped with phosphorous.

As shown, components of PMOS GAA transistor structure 506 and NMOS GAA transistor structure 504 are separated by dielectric materials inclusive of dielectric layer 542 and dielectric layer 541. Source contact 150, drain contact 154, source contact 130, and drain contact 134, having any characteristics discussed herein, contact source 514, drain 516, source 524, and drain 526, respectively. PMOS GAA transistor structure 506 and NMOS GAA transistor structure 504 also include gate contacts, which may be provided as discussed with respect to FIG. 4H either in or out of the plane illustrated in FIG. 5. Notably, source contact 130 and drain contact 134 include contact layer 131 including co-deposited titanium and silicon. Contact layer 131 may be substantially pure titanium and silicon (e.g., titanium silicide) or contact layer 131 may include germanium due to diffusion of germanium from the epitaxial silicon germanium of source 524 and drain 526. For example, contact layer 131 may be titanium germanosilicide with not more than 10% germanium, not more than 5% germanium, or not more than 2.5% germanium. In some embodiments, contact layer 151 of source contact 150 and drain contact 154 include -deposited titanium and silicon. Contact layer 151 may be substantially pure titanium and silicon (e.g., titanium silicide) or contact layer 151 may include a third material due to diffusion of from source 514 and drain 516. For example, contact layer 151 may be titanium germanosilicide with not more than 1% of the diffused material, such as phosphorous. GAA transistor structure 500 may be formed using any suitable technique or techniques such as those discussed herein with respect to FIGS. 3 and 4A-4H.

Figure 6:
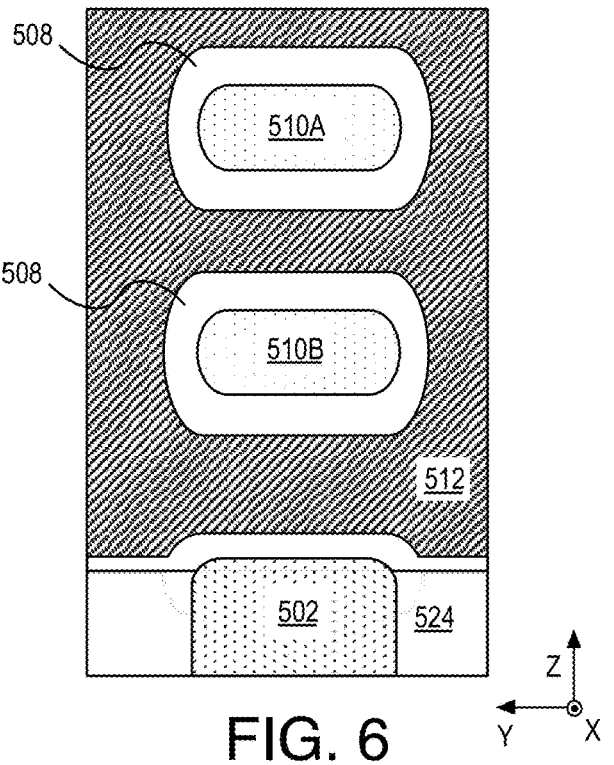
FIG. 6 is an illustration of a cross-sectional view of the gate all around transistor structure of FIG. 5 taken along a plane thereof.

FIG. 6 is an illustration of a cross-sectional view of a GAA transistor structure 500 taken along the A-A' plane, arranged in accordance with at least some implementations of the present disclosure. As shown, channel regions 510A, B of PMOS GAA transistor structure 506 may extend within gate electrode 512 such that channel regions 510A, B are separated from gate electrode 512 by gate dielectric 518. Channel regions 510A, B may extend in the x-direction into a portion of source 524 and/or drain 526 such that channel regions 510A, B are at least partially embedded into source 524 and/or drain 526 for increased support and structural strength. NMOS GAA transistor structure 504 may have a similar cross-sectional structure illustrated with respect to PMOS GAA transistor structure 506.

Figure 7:
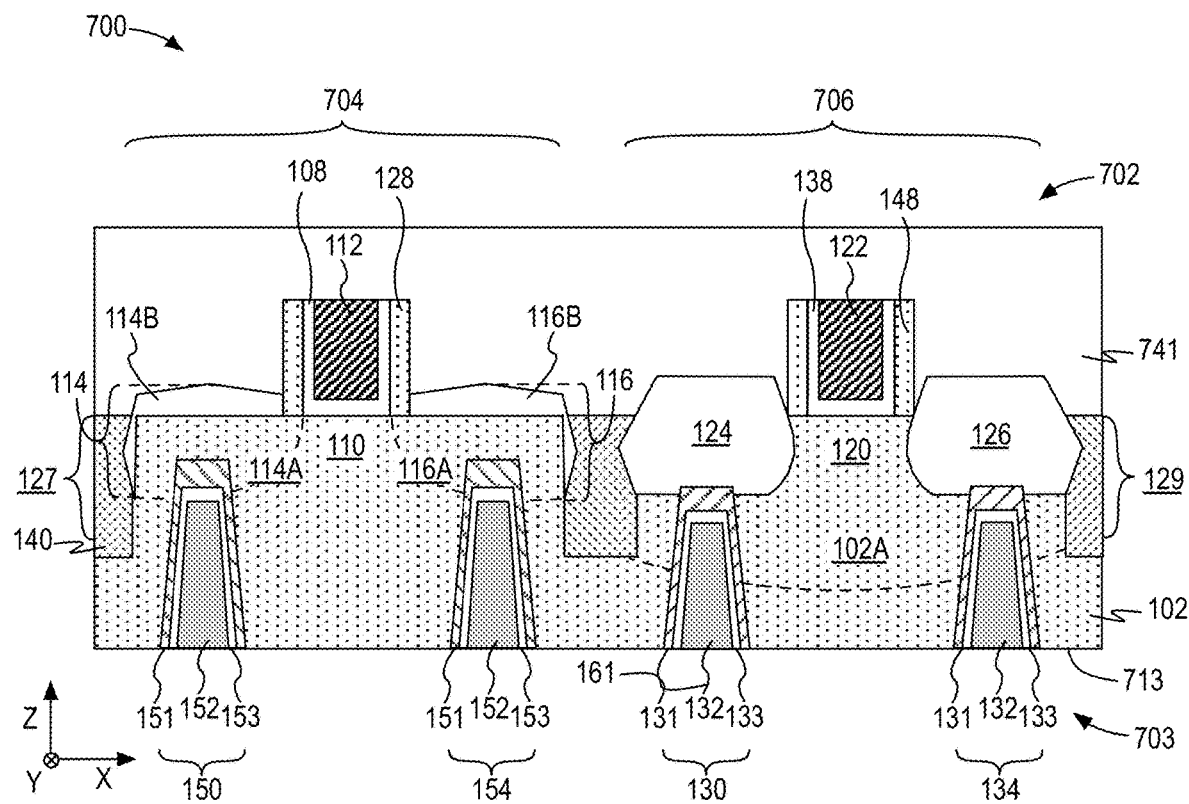
FIG. 7 is an illustration of a cross-sectional side view of a transistor structure having back side source and drain contacts including a co-deposited titanium and silicon layer.

FIG. 7 is an illustration of a cross-sectional side view of a transistor structure 700 having back side source and drain contacts including a co-deposited titanium and silicon layer, arranged in accordance with at least some implementations of the present disclosure. As shown, transistor structure 700 includes an NMOS transistor structure 704 and a PMOS transistor structure 706, which may include any features or characteristics discussed with respect to NMOS transistor structure 104 and a PMOS transistor structure 106. For example, common reference numbers may share any materials, dimensions, or structures as discussed herein. As shown in FIG. 7, some components of NMOS transistor structure 704 and PMOS transistor structure 706 may be covered by a dielectric material 741. In contrast to top or front side 702 contacts as illustrated with respect to transistor structure 100, transistor structure 700 has back side 703 contacts such that source contact 150, drain contact 154, source contact 130, and drain contact 134 extend from a back surface 713 of substrate 102. As used herein, the term back side indicates contacts that extend to sources and drains from a surface or side opposite that of the gate side of the device.

For example, substrate 102 may be subject to a back side grind operation or etch processing or the like to thin substrate 102. In addition or in the alternative, a dielectric layer may be formed over the back side of the substrate or a surface exposed after the back side grid or etch. Subsequently, the substrate or dielectric layer may be patterned as discussed with respect to FIG. 4B such that the patterning is from the back side of NMOS transistor structure 704 and a PMOS transistor structure 706. A contact layer including titanium and silicon, an optional adhesion layer such as titanium nitride, and a bulk fill metal may then be provided as discussed with respect to FIGS. 4C, 4D, and 4F in analogy with contact layer 431, layer 441, and bulk metal fill layer 461. Furthermore, anneal processing as discussed with respect to FIG. 4E may be performed after deposition of layer 441 or at another point in the process flow subsequent to co-deposition of contact layer 431. Planarization may then be performed as discussed with respect to FIG. 4G to form back side contacts. Such back side contacts may have any characteristics discussed herein Furthermore, gate contacts, either in plane or out of plane with the cross section may be provided from front side 702.

Figure 8:
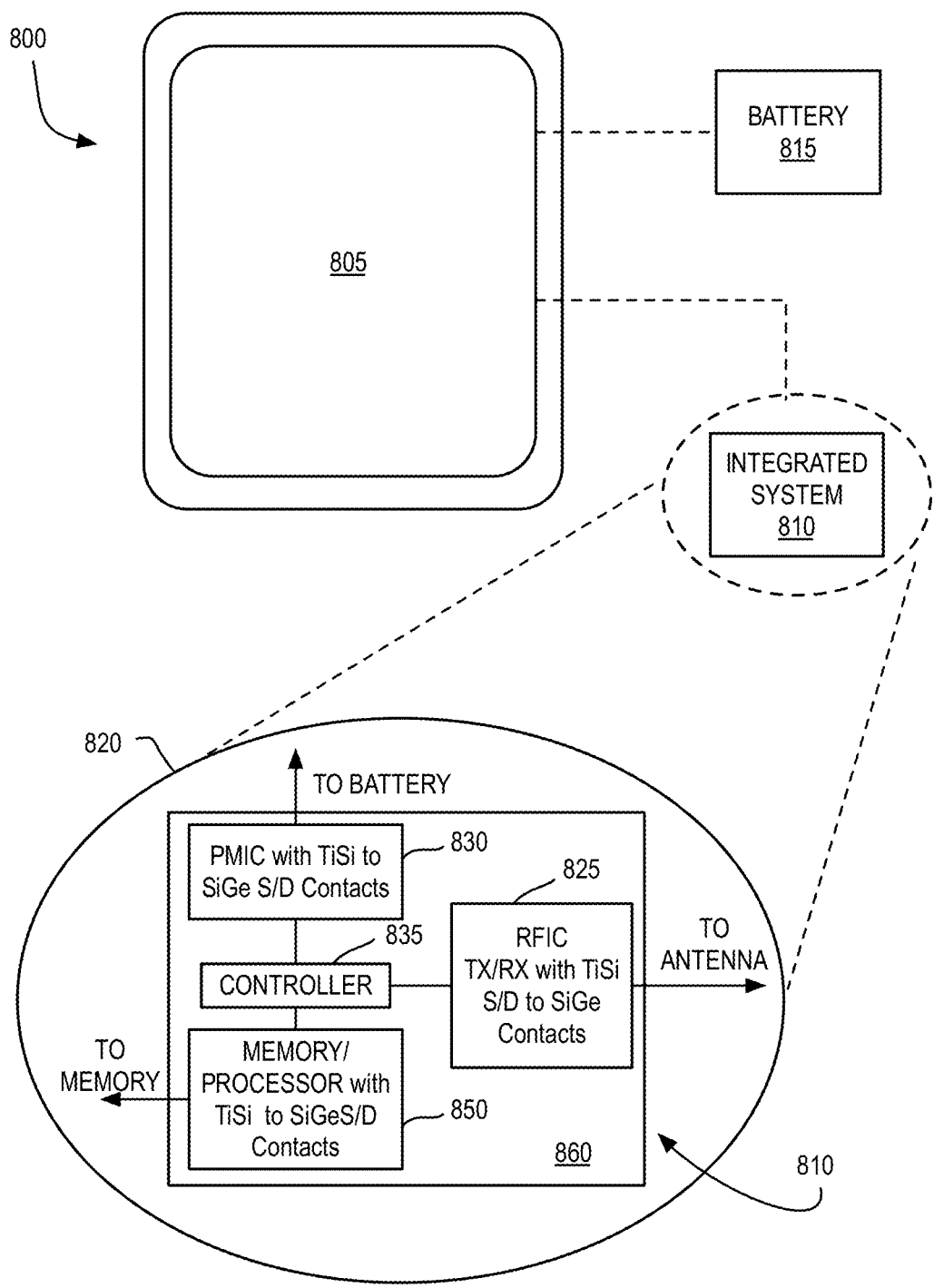
FIG. 8 is an illustrative diagram of a mobile computing platform employing a device having a titanium and silicon contact layer coupled to a silicon and germanium source or drain.

FIG. 8 is an illustrative diagram of a mobile computing platform 800 employing a device having a titanium and silicon contact layer coupled to a silicon and germanium source or drain, arranged in accordance with at least some implementations of the present disclosure. Any die or device having a transistor structure inclusive of any components, materials, or characteristics discussed herein may be implemented by any component of mobile computing platform 800. Mobile computing platform 800 may be any portable device configured for each of electronic data display, electronic data processing, wireless electronic data transmission, or the like. For example, mobile computing platform 800 may be any of a tablet, a smart phone, a netbook, a laptop computer, etc. and may include a display screen 805, which in the exemplary embodiment is a touchscreen (e.g., capacitive, inductive, resistive, etc. touchscreen), a chip-level (system on chip—SoC) or package-level integrated system 810, and a battery 815. Battery 815 may include any suitable device for providing electrical power such as a device consisting of one or more electrochemical cells and electrodes to couple to an outside device. Mobile computing platform 800 may further include a power supply to convert a source power from a source voltage to one or more voltages employed by other devices of mobile computing platform 800.

Integrated system 810 is further illustrated in the expanded view 820. In the exemplary embodiment, packaged device 850 (labeled "Memory/Processor" in FIG. 8) includes at least one memory chip (e.g., RAM), and/or at least one processor chip (e.g., a microprocessor, a multi-core microprocessor, or graphics processor, or the like). In an embodiment, the package device 850 is a microprocessor including an SRAM cache memory. As shown, device 850 may employ a die or device having any transistor structures and/or related characteristics discussed herein. Packaged device 850 may be further coupled to (e.g., communicatively coupled to) a board, a substrate, or an interposer 860 along with, one or more of a power management integrated circuit (PMIC) 830, RF (wireless) integrated circuit (RFIC) 825 including a wideband RF (wireless) transmitter and/or receiver (TX/RX) (e.g., including a digital baseband and an analog front end module further comprises a power amplifier on a transmit path and a low noise amplifier on a receive path), and a controller 835 thereof. In general, packaged device 850 may be also be coupled to (e.g., communicatively coupled to) display screen 805. As shown, one or both of PMIC 830 and/or RFIC 825 may employ a die or device having any transistor structures and/or related characteristics discussed herein.

Functionally, PMIC 830 may perform battery power regulation, DC-to-DC conversion, etc., and so has an input coupled to battery 815 and with an output providing a current supply to other functional modules. In an embodiment, PMIC 830 may perform high voltage operations. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 850 or within a single IC (SoC) coupled to the package substrate of the packaged device 850.

Figure 9:
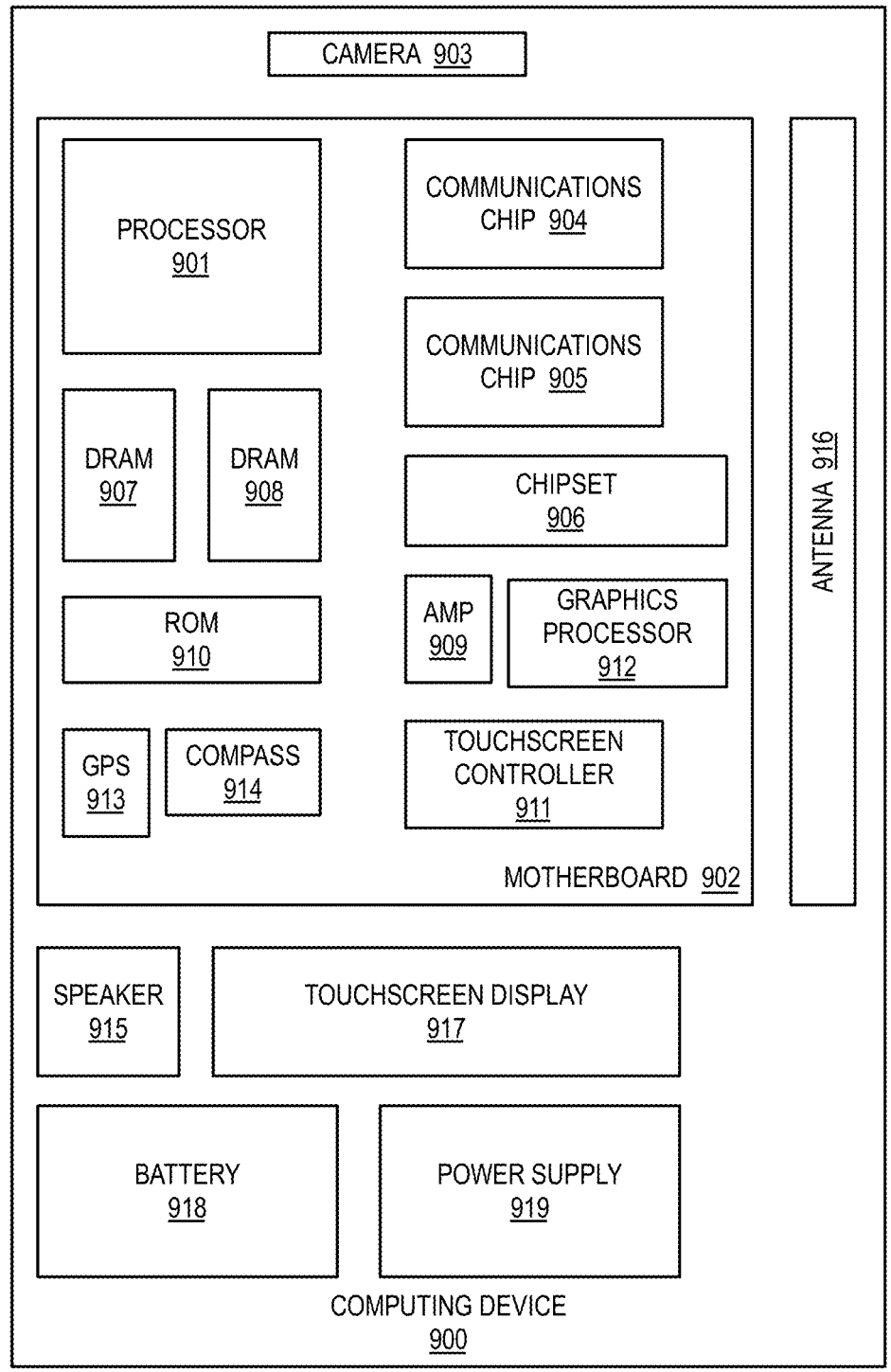
FIG. 9 is a functional block diagram of a computing device, all arranged in accordance with at least some implementations of the present disclosure.

FIG. 9 is a functional block diagram of a computing device 900, arranged in accordance with at least some implementations of the present disclosure. Computing device 900 may be found inside platform 800, for example, and further includes a motherboard 902 hosting a number of components, such as but not limited to a processor 901 (e.g., an applications processor) and one or more communications chips 904, 905. Processor 901 may be physically and/or electrically coupled to motherboard 902. In some examples, processor 901 includes an integrated circuit die packaged within the processor 901. In general, the term "processor" may refer to any device or portion of a device that processes electronic data from registers and/or memory to transform that electronic data into other electronic data that may be stored in registers and/or memory. Any one or more device or component of computing device 900 may include a die or device having any transistor structures and/or related characteristics discussed herein as discussed herein.

In various examples, one or more communication chips 904, 905 may also be physically and/or electrically coupled to the motherboard 902. In further implementations, communication chips 904 may be part of processor 901. Depending on its applications, computing device 900 may include other components that may or may not be physically and electrically coupled to motherboard 902. These other components may include, but are not limited to, volatile memory (e.g., DRAM) 907, 908, non-volatile memory (e.g., ROM) 910, a graphics processor 912, flash memory, global positioning system (GPS) device 913, compass 914, a chipset 906, an antenna 916, a power amplifier 909, a touchscreen controller 911, a touchscreen display 917, a speaker 915, a camera 903, a battery 918, and a power supply 919, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 904, 905 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 904, 905 may implement any of a number of wireless standards or protocols, including but not limited to those described elsewhere herein. As discussed, computing device 900 may include a plurality of communication chips 904, 905. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 919 may convert a source power from a source voltage to one or more voltages employed by other devices of mobile computing platform 800. In some embodiments, power supply 919 converts an AC power to DC power. In some embodiments, power supply 919 converts an DC power to DC power at one or more different (lower) voltages. In some embodiments, multiple power supplies are staged to convert from AC to DC and then from DC at a higher voltage to DC at a lower voltage as specified by components of computing device 900.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, a transistor structure comprises a channel region between a source and drain, the source and drain each comprising silicon and germanium, a gate electrode adjacent to the channel region, and a contact comprising a contact layer on at least one of the source or drain, the contact layer comprising titanium, silicon, and germanium comprising a germanium concentration of not more than 5%.

In one or more second embodiments, further to the first embodiment, the germanium concentration of the contact layer is not more than 2.5% and the contact layer is absent boron.

In one or more third embodiments, further to the first or second embodiments, the transistor structure further comprises a dielectric layer comprising a sidewall adjacent the contact, and the contact layer extends from the source or drain at least partially along the sidewall.

In one or more fourth embodiments, further to any of the first through third embodiments, a first thickness of the contact layer on the source or drain is not less than 1.25 times a second thickness of the contact layer along the sidewall.

In one or more fifth embodiments, further to any of the first through fourth embodiments, a first thickness of the contact layer on the source or drain and a second thickness of the contact layer along the sidewall differ by not more than 10%.

In one or more sixth embodiments, further to any of the first through fifth embodiments, the transistor structure further comprises a second channel region between a second source and drain, the second source and drain each comprising silicon and phosphorous and a second contact comprising a second layer on at least one of the source or drain, the second layer comprising titanium and silicon.

In one or more seventh embodiments, further to any of the first through sixth embodiments, the source and drain each comprise boron doped epitaxial silicon germanium having substantially equal concentrations of silicon and germanium, and the contact layer comprises a thickness in the range of 2 to 10 nm.

In one or more eighth embodiments, further to any of the first through seventh embodiments, the contact further comprises a second layer and a fill material over the second layer, the second layer comprising titanium and nitride and the fill material comprising at least one of cobalt or tungsten.

In one or more ninth embodiments, further to any of the first through eighth embodiments, the channel region, source, drain, and gate electrode are over a substrate layer or a dielectric layer, and the contact extends through an opening in the substrate layer or the dielectric layer.

In one or more tenth embodiments, further to any of the first through ninth embodiments, the contact layer extends from the source or drain at least partially along a sidewall of the opening.

In one or more eleventh embodiments, further to any of the first through tenth embodiments, the channel region comprises a region of one of a planar transistor, a multi-gate transistor, or a gate all around transistor.

In one or more twelfth embodiments, a system comprises a power supply and an integrated circuit die coupled to the power supply, the integrated circuit die comprising a transistor structure according to any of the first through eleventh embodiments.

In one or more thirteenth embodiments, a method of fabricating an integrated circuit comprises exposing a source and drain each comprising silicon and germanium, such that a channel region is between the source and drain and a gate electrode is over the channel region, co-depositing titanium and silicon in contact with at least one of the source or drain, annealing the co-deposited titanium and silicon to form a contact layer on the source or drain, and providing a bulk metal over the contact layer to provide a contact to the source or drain.

In one or more fourteenth embodiments, further to the thirteenth embodiment, co-depositing the titanium and silicon comprises one of a chemical vapor deposition or a physical vapor deposition.

In one or more fifteenth embodiments, further to the thirteenth or fourteenth embodiments, exposing the source and drain comprises forming an opening comprising a sidewall in a dielectric layer, and the contact layer is on the source or drain and at least partially along the sidewall.

In one or more sixteenth embodiments, further to any of the thirteenth through fifteenth embodiments, the contact layer comprises titanium, silicon, and germanium comprising a germanium concentration of not more than 5%.

In one or more seventeenth embodiments, further to any of the thirteenth through sixteenth embodiments, exposing the source and drain further comprises exposing a second source and drain comprising silicon and phosphorous, a second channel region is between the second source and drain and a second gate electrode is over the second channel region, and co-depositing the titanium and silicon further comprises co-depositing titanium and silicon in contact with the second source and drain.

In one or more eighteenth embodiments, further to any of the thirteenth through seventeenth embodiments, the source and drain each comprise epitaxial silicon germanium having substantially equal concentrations of silicon and germanium, and co-depositing the titanium and silicon comprises co-deposition of titanium monosilicide.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
   a channel region between a source and a drain, the source and the drain each comprising silicon and germanium;
   a gate electrode adjacent to the channel region; and
   a contact comprising a contact layer on at least one of the source or the drain, the contact layer comprising titanium, silicon, and germanium comprising a germanium concentration of not more than 5% at any position through a thickness of the contact layer.

2. The apparatus of claim 1, wherein the germanium concentration of the contact layer is not more than 2.5% at any position through the thickness of the contact layer.

3. The apparatus of claim 1, further comprising:
   a dielectric layer comprising a sidewall adjacent the contact, wherein the contact layer extends from the source or drain at least partially along the sidewall.

4. The apparatus of claim 3, wherein a first thickness of the contact layer on the source or drain is not less than 1.25 times a second thickness of the contact layer along the sidewall or the first thickness and the second thickness differ by not more than 10%.

5. The apparatus of claim 1, further comprising:
   a second channel region between a second source and drain, the second source and drain each comprising silicon and phosphorous; and
   a second contact comprising a second layer on at least one of the source or drain, the second layer comprising titanium and silicon.

6. The apparatus of claim 1, wherein the source and drain each comprise boron doped epitaxial silicon germanium having substantially equal concentrations of silicon and germanium, and the contact layer comprises a thickness of not less than 2 nm and not more than 10 nm.

7. The apparatus of claim 1, wherein the contact further comprises a second layer and a fill material over the second layer, the second layer comprising titanium and nitrogen, and the fill material comprising at least one of cobalt or tungsten.

8. The apparatus of claim 1, wherein the channel region, source, drain, and gate electrode are over a substrate layer or a dielectric layer, and wherein the contact extends through an opening in the substrate layer or the dielectric layer.

9. The apparatus of claim 1, wherein the channel region comprises a region of one of a planar transistor, a multi-gate transistor, or a gate all around transistor.

10. The apparatus of claim 1, further comprising:
    a power supply; and
    an integrated circuit die coupled to the power supply, the integrated circuit die comprising the channel region, the source, the drain, the gate electrode, and the contact.

11. An apparatus, comprising:
    a channel region between a source and a drain, the source and the drain each comprising silicon and germanium;
    a gate electrode adjacent to the channel region; and
    a contact comprising a contact layer on at least one of the source or the drain, the contact layer comprising titanium, silicon, and germanium comprising an average germanium concentration of not more than 2.5% through a thickness of the contact layer.

12. The apparatus of claim 11, wherein the average germanium concentration of the contact layer comprises a germanium concentration of not more than 1% at any position through the thickness of the contact layer.

13. The apparatus of claim 11, further comprising:
a dielectric layer comprising a sidewall adjacent the contact, wherein the contact layer extends from the source or drain at least partially along the sidewall.

14. The apparatus of claim 13, wherein a first thickness of the contact layer on the source or drain is not less than 1.25 times a second thickness of the contact layer along the sidewall or the first thickness and the second thickness differ by not more than 10%.

15. The apparatus of claim 11, further comprising:
a second channel region between a second source and drain, the second source and drain each comprising silicon and phosphorous; and
a second contact comprising a second layer on at least one of the source or drain, the second layer comprising titanium and silicon.

16. The apparatus of claim 11, wherein the source and drain each comprise boron doped epitaxial silicon germanium having substantially equal concentrations of silicon and germanium, and the contact layer comprises a thickness of not less than 2 nm and not more than 10 nm.

17. The apparatus of claim 1, wherein the contact further comprises a second layer and a fill material over the second layer, the second layer comprising titanium and nitrogen, and the fill material comprising at least one of cobalt or tungsten.

18. The apparatus of claim 11, wherein the channel region, source, drain, and gate electrode are over a substrate layer or a dielectric layer, and wherein the contact extends through an opening in the substrate layer or the dielectric layer.

19. The apparatus of claim 11, wherein the channel region comprises a region of one of a planar transistor, a multi-gate transistor, or a gate all around transistor.

20. The apparatus of claim 11, further comprising:
a power supply; and
an integrated circuit die coupled to the power supply, the integrated circuit die comprising the channel region, the source, the drain, the gate electrode, and the contact.

* * * * *